United States Patent [19]
Goetz

[11] Patent Number: 6,120,286
[45] Date of Patent: Sep. 19, 2000

[54] VAPORIZER BOAT FOR METAL VAPORIZING

[75] Inventor: Ulrich Goetz, Buching, Germany

[73] Assignee: Sintec Keramik GmbH & Co. KG, Buching, Germany

[21] Appl. No.: 09/093,269

[22] Filed: Jun. 8, 1998

Related U.S. Application Data

[63] Continuation of application No. PCT/DE96/02338, Dec. 5, 1996.

[51] Int. Cl.$^7$ ...................................................... C21D 9/00
[52] U.S. Cl. ........................... 432/261; 432/253; 432/262; 432/263; 432/264; 266/900; 266/275
[58] Field of Search ..................................... 432/262, 263, 432/264, 253, 261; 266/900, 275; 13/25; 427/444

[56] References Cited

U.S. PATENT DOCUMENTS

| | | | |
|---|---|---|---|
| 2,996,412 | 8/1961 | Alexander et al. | 117/221 |
| 3,117,887 | 1/1964 | Shepard et al. | 117/107.1 |
| 4,089,643 | 5/1978 | Jerabek et al. | 432/262 |
| 4,446,357 | 5/1984 | Barshter | 219/275 |

OTHER PUBLICATIONS

F. Erhart, "Preferentially Heated Structure (Crucible)", Xerox Disclosure Journal, vol. 1, No. 6, Jun. 1976, US, p. 19.
E.D. Parent, "Bar Sources in Metallizing", Proc. 21st Annual Society of Vacuum Coaters Technical Conference, 1978, pp. 8–18.

*Primary Examiner*—Shrive Beck
*Assistant Examiner*—Norca L. Torres-Velazquez
*Attorney, Agent, or Firm*—Lyon & Lyon LLP

[57] ABSTRACT

The invention concerns a resistance-heated vaporizer boat for vaporizing metal. According to the invention, a reduced temperature is generated in the edge region, i.e., along the longitudinal edge of the vaporizer boat, such that there is only a very slight wetting tendency along this longitudinal edge. Consequently, the melt can be localized such that it cannot overflow over the longitudinal edges of the vaporizer boat, without a cavity necessarily having to be provided in the vaporization surface of the vaporizer boat. As a result, optimum wetting and constantly targeted vaporization of the metal upwards towards the area to be vapor-deposited are attained.

10 Claims, 2 Drawing Sheets

VAPORIZER BOAT FOR METAL VAPORIZING

This is a continuation of International Application PCT/DE96/02338, with International Filing Date of Dec. 5, 1996, which is based on German Patent Application 195 45 914.8, filed Dec. 8, 1995.

BACKGROUND OF THE INVENTION

The field of the present invention is ceramic vaporizer boats for vaporizing metal using such boats.

Metal-vaporizing methods and suitable vaporizer boats are generally known from the prior art. These prior art vaporizer boats are made of an electrically conductive ceramic material, with titaniumdiboride being commonly used for the conductive phase, and boron nitride or boron nitride plus aluminum nitride for the insulating phase. In the prior art, these vaporizer boats are made in the form of elongated rods with a substantially rectangular or square cross section. Typical cross-sectional dimensions are 10×20 mm, 10×30 mm or 12×19 mm. Typical rod lengths are, for example, 150 to 250 mm. The longitudinal ends of the vaporizer boats are connected to a power source, so that there is a certain current per unit of cross-sectional area which flows homogeneously through the vaporizer boats in a longitudinal direction, so that the entire vaporizer boat acts as a heating resistor and is, thus, relatively homogeneously heated. It is common practice to provide these vaporizer boats with front-surface contacts by pressing clamping jaws against the front surfaces of the respective vaporizer boat. The clamping jaws themselves are usually connected to a water-cooled electric conductor which is preferably made of copper. The ceramic material of the vaporizer boat may typically have a resistivity of 800 $\mu\Omega$cm, for example.

In conventional vaporizing methods, the metal to be vaporized is usually aluminum or one of its alloys and is supplied onto the vaporizer boat in the form of a wire, for example, in order to initiate the melting process and to cause the vaporizer boat to be wetted by the melt. Since the cross-sectional area of the vaporizer boat is relatively evenly heated, which is due to the substantially homogeneous resistivity, the vaporizer boat is in its transverse direction also relatively evenly wet by the aluminum melt. However, this wetting characteristic also causes the aluminum to flow laterally over the longitudinal edges of the vaporizer boat, so that the metal vaporizes horizontally from the lateral surfaces instead of being vaporized in an upward direction. Common vaporizers are designed such that the surface to be coated by vaporization is moved past in a position above the vaporizer boat, e.g. a capacitor film for the manufacture of wound capacitors. An undesirable lateral vaporization, however, entirely or at least partially prevents the vaporized aluminum particles from reaching the capacitor film to be coated by vaporization. Instead, the metal will be deposited somewhere else, e.g. in some place on the wall of the evacuated chamber where the vaporizer boat and the area to be coated by vaporization are disposed. The result is a considerably more difficult and expensive maintenance of the vaporizer, because the chamber is gradually clogged by aluminum deposits which are very difficult to remove.

To prevent the aluminum melt from flowing over the lateral edges, prior art vaporizer boats have been provided with a cavity formed by milling, for example, and extending longitudinally along the vaporizer boat. The aluminum melt could thus spread inside the cavity like in an elongated crucible. It was found, however, that the melt would also flow over the transverse edges of the cavity, run down over the longitudinal edges of the boat and finally vaporize there. It was not practical either to provide the longitudinal recess in the vaporizer boat with any desired depth, since this produced an undesirably large cross-sectional area of the melt, which in turn unfavorably changed the conditions of the process. More specifically, an excessive amount of current would be conducted through the melt itself and would bypass the ceramic material forming the heating resistor. Apart from this, it was rather expensive to produce the cavity or trough by milling.

In addition to preventing the melt from flowing lateral over the longitudinal edges, it is also desirable to minimize the energy losses from the vaporizer boat caused by thermal radiation. At the same time, however, it has to be ensured that the shape of the vaporizer boat can still be manufactured easily and cost-effectively.

The U.S. Pat. No. 2,996,412 discloses an inhomogeneous vaporizer boat which is not included in the generic category and which is not exclusively made of ceramic material. A metallic strip of superior conductivity is placed in the center of a carbon substrate. Because the central metallic strip heats up to a higher temperature than the substrate surrounding it, the central portion is supposed to heat up to a higher temperature as well in order to localize the melt disposed along the central portion.

The printed specification Xerox Disclosure Journal, volume 1 no. 6, June 1976, US, page 19, discloses a tube having a highly reflective upper surface and a highly emissive (black) lower surface. These different reflection characteristics are to result in the temperature at the highly emissive surface being higher than that at the highly reflective surface. A localization of the melt is not achieved by means of these different reflection characteristics of the upper and lower surface, and this is also not intended since there is not even a theoretical possibility that the melt might flow over the lateral edges of the receiving cavity having the cross section of a semicircular tube.

The printed specification U.S. Pat. No. 3,117,887 very generally discloses a conventional ceramic vaporizer boat having a rectangular cross section.

The printed specification E. D. Parent "Bar Sources in Metallizing" Soc. of Vac Coaters, Proc 21st Annual Technical Conference (1978), p. 8–18, discloses conventional rectangular vaporizers which are included in the generic category and which comprise an height-to-width ratio of 1:3. Furthermore, vaporizers are known which are included in the generic category and which have a triangular cross section of undefined height-to-width ratio. This triangular cross section is intended to save energy as compared to the rectangular cross section.

The printed specification U.S. Pat. No. 4,089,643 discloses vaporizer boats having a triangular cross section in the form of an equilateral triangle, as well as in the form of isosceles triangles with an otherwise undefined height-to-width ratio. This triangular cross section is intended to save energy as compared to the rectangular cross section.

SUMMARY OF THE INVENTION

The objective of the present invention is to provide methods as well as a device which can improve conventional, homogeneous ceramic vaporizer boats in such a way that the vaporizer boat will be evenly wetted in the longitudinal direction, and that at the same time the melt will be prevented from flowing over the longitudinal edges of the vaporizer boat in the transverse direction, with the device being easily and inexpensively produced.

According to the present invention, the foregoing is achieved by a resistance-heated, ceramic vaporizer boat defined by an elongate center portion with elongate edge portions integral and homogeneous therewith with a vaporization surface extending across these portions. The center portion is on average substantially thicker than the elongate edge portions and the elongate edge portions have a substantially higher heat dissipation rate than the center portion.

A finding of significant importance for the invention is the fact that the wetting tendency of the aluminum melt varies depending on its temperature; or, to put it differently, that hotter surfaces tend to be wet more easily by the aluminum melt than cooler ones. Provided that the resistivity of the vaporizer boat is homogeneous across the cross-sectional area of the latter, the cross-sectional area heats up substantially evenly. If, however, heat is dissipated from the edges, the temperature of the edges will decrease by the amount of heat dissipated. Below a certain temperature, below which the edges may be cooled, for example, wetting will not occur at all. As a result, the melt is prevented from flowing over the edges of the vaporizer boat, while at the same time its spreading on the vaporizer boat in the longitudinal direction is ensured. The calculated dissipation of heat from the edges of the vaporizer boat enables an optimum spreading of the melt on the vaporizer boat, and it prevents a lateral vaporization and ensuing increased soiling tendency of the vaporizer on a whole, as well as energy losses and material losses caused by uncontrolled vaporization.

According to a preferred embodiment of the present invention, heat can be selectively dissipated by thermal conduction in addition to thermal radiation, e.g. when a heat conducting material is connected to the edge portion of the vaporizer boat so that heat is dissipated from this edge portion into the vaporizer housing.

According to the first alternative of the vaporizer boat according to the invention, the vaporizer boat is substantially T-shaped, with the elongate center portion which is a so-called "web" of the "T"-profile being relatively thick and short, whereas two elongate edge portions which are the upper "legs" of the "T"-profile may be relatively thin-walled, thus, forming a kind of cooling fin in the edge portion.

According to the second alternative of the vaporizer boat according to the invention, the vaporizer boat has the shape of a flat triangle, with the width-to-height ratio of the triangle being at least 2:1. A particularly advantageous width-to-height ratio is 30 mm:10 mm, for example. On the one hand, the flat triangle provides a relatively wide evaporation surface having a width of 30 mm, and on the other hand there is an increase from the center towards the edges in the ratio between the surface area of the vaporizer boat and the volume enclosed in the transverse direction. Apart from this, the triangular cross section can be manufactured relatively easily from solid stock by sawing. Because of the relatively wide evaporation surface of 30 mm, a cavity for the localization of the melt may even be dispensed with at all. Last but not least, the area sum of the two downwardly inclined "radiation-loss surfaces" of the flat triangle is relatively small as compared to the area sum of the three "radiation-loss surfaces" of a conventional rectangular cross section, when seen in relation to the respective evaporation area of the triangular cross section and the rectangular cross section, respectively.

According to an advantageous development, as indicated earlier, the vaporizer boat is provided with an entirely even upper evaporation surface. In other words, the evaporation surface does not comprise a recess in which the melt is to accumulate. Thus, the localization of the melt is exclusively based on the fact that the wetting tendency varies according to temperature, i.e. on the fact that the edge portion has a lower temperature and, therefore, no wetting tendency at all. This embodiment can be particularly advantageously implemented together with the above described flat triangle, which has an width-to-height ratio of 30 mm:10 mm, for example.

BRIEF DESCRIPTION OF THE DRAWINGS

The preferred embodiments of the present invention will be further described with reference to the drawings.

DETAILED DESCRIPTION OF THE PREFERRED EMBODIMENTS

Figure 1:
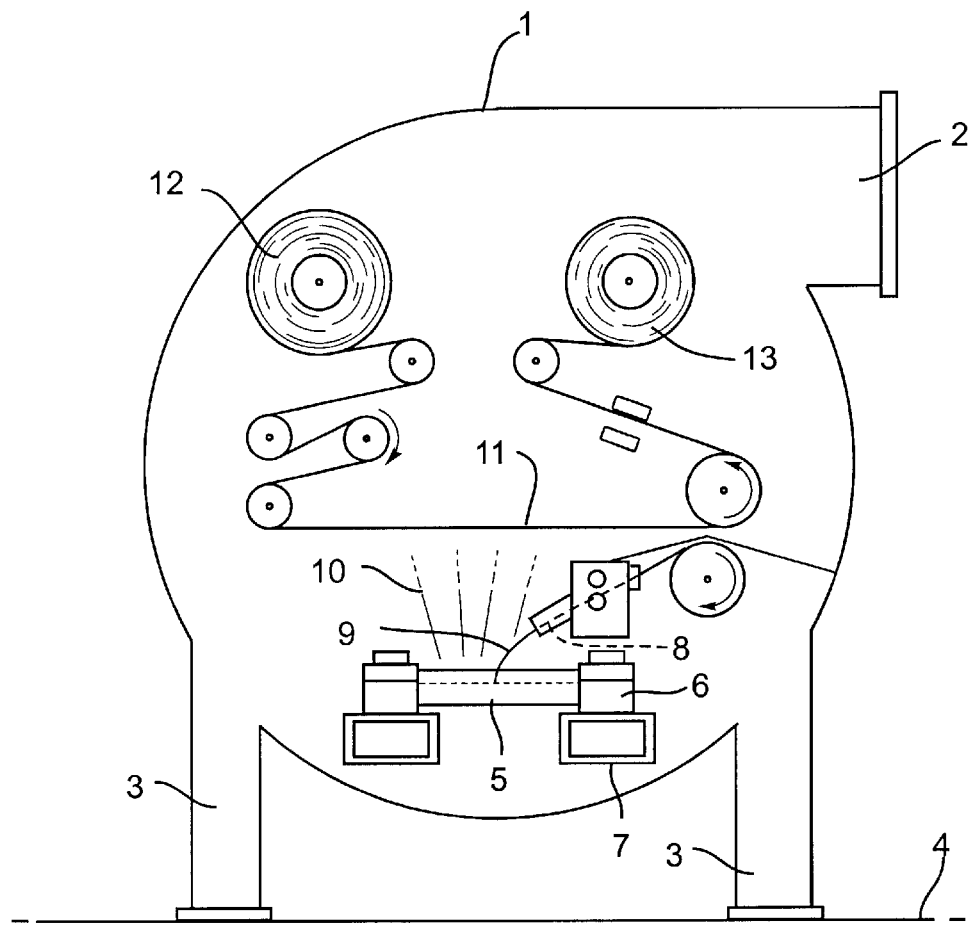
FIG. 1 is a schematic sectional view of the complete vaporizer.

The vaporizer shown in FIG. 1 is provided with a housing 1 which is connected to a vacuum source via a conduit 2, so that the pressure inside the housing 1 will be below atmospheric pressure. The vaporizer may be positioned on the floor 4 by means of stands 3. A vaporizer boat 5 being made of titaniumdiboride according to this embodiment, and being provided with an insulating phase made of boron nitride or boron nitride plus aluminum nitride, is fixed between clamping jaws 6 in such a way that in each end portion in the longitudinal direction of the vaporizer boat an electrical contact is provided to the water-cooled electric conductors 7.

An aluminum wire 9 is supplied onto the vaporizer boat 5 by means of a supply nozzle 8. The aluminum wire melts on the vaporizer boat 5 and vaporizes upwardly in the direction indicated by the arrows 10, where the film 11 to be coated by vaporization is moved past. The film 11 is electrostatically charged in such a way that the aluminum molecules vaporized by the vaporizer boat 5 are deposited on the film 11, which may be a capacitor film for the production of wound capacitors, for example. The film 11 may be unwound from a supply reel 12, and another supply reel 13 may be used for receiving the vapor-deposited aluminum film.

Figure 2:
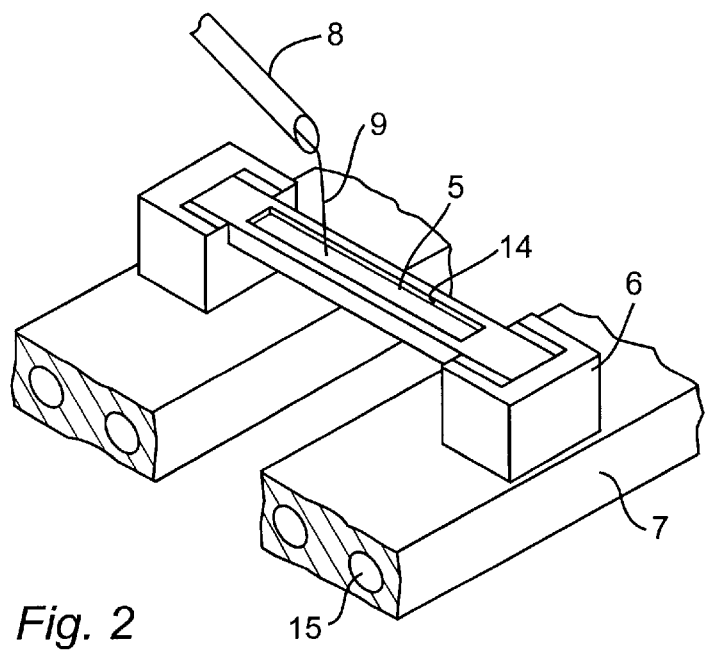
FIG. 2 shows a perspective view of an embodiment of a clamping means for a vaporizer boat according to the embodiment shown in FIG. 1.

FIG. 2 is a detailed illustration of the clamping jaws 6 which firmly enclose the vaporizer boat 5. A cavity 14 is formed in the vaporizer boat, into which the aluminum wire 9 is fed by the wire supply nozzle 8. The clamping jaws are firmly pressed against the longitudinal front surfaces of the vaporizer boat, so that the entire front area of the vaporizer boat is completely contacted. The clamping jaws 6 are electroconductively connected to the electrical conductor 7, which according to this embodiment is made of copper. The conductor 7 is water-cooled by means of conduits 15 with cooling water flowing inside. In the longitudinal direction of the vaporizer boat 5, a localization of the aluminum melt is caused by the vaporizer boat 5 being fixed between the clamping jaws 6 and being, thus, thermoconductively connected to the cooled electrical conductor 7, so that the end portions of the vaporizer boat 5 will naturally be cooler and, thus, will have a decreased wetting tendency, resulting in the aluminum melt to be localized in the longitudinal direction of the vaporizer boat 5.

Figure 3:
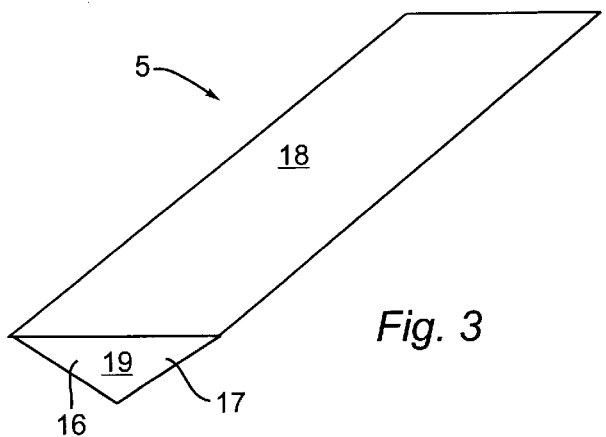
FIGS. 3–5 are perspective views showing embodiments of the vaporizer boat.
Figure 4:
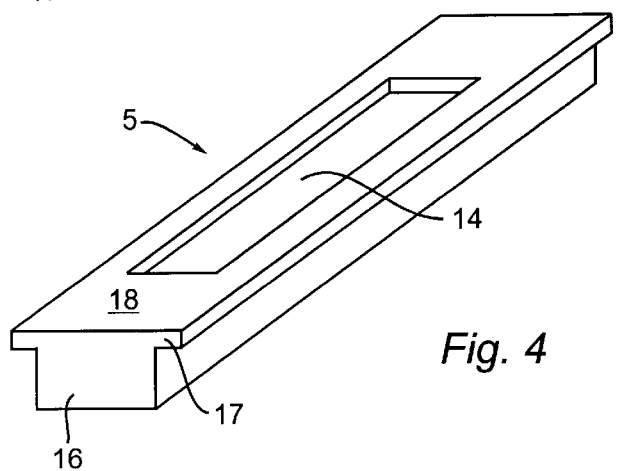
Figure 5:
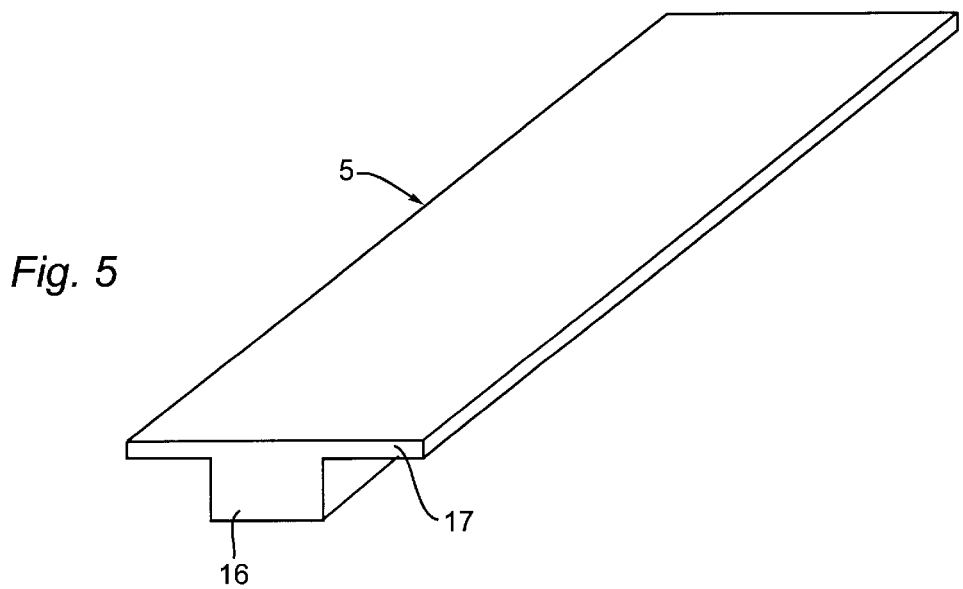

FIG. 3 to 5 show embodiments with the entire vaporizer boat being made of a homogeneous material, whereas the cross section is formed such that more heat is dissipated by thermal radiation from the edge portions 17 than from the central portion 16. More specifically, the vaporizer boat shown in full scale in FIG. 3 has the cross section of a flat triangle. The cross-sectional area, i.e. the evaporation surface 18, has a width of 30 mm, with the height of the triangle being 10 mm or, to put it differently, the apex line of the triangular cross section extending parallel to the evaporation surface 18. With this type of cross section, the clamping jaws 6 are applied such that the complete cross-sectional area will be contacted, i.e. the clamping jaws 6 are pressed firmly against the front surfaces 19 of the vaporizer boat 5. The vaporizer boat according to FIG. 5 may of course also be provided with a cavity 14. In the embodiment shown in FIG. 3, however, the cavity 14 has been entirely dispensed with, and the localization of the aluminum melt is achieved only by means of the areas of different temperature at the end of the vaporizer boat as well as along the longitudinal edge of the vaporizer boat, caused by the dissipation of heat induced by the clamping jaws 6 and, according to the preferred embodiment and with the cross-sectional form used in there, by the increased thermal radiation from the edge portion 17.

A respective cross-sectional form is shown in FIGS. 4 and 5, with the cross section being "T"-shaped, and with the evaporation surface 18 of the embodiment shown in FIG. 4 being provided with a cavity 14. In the embodiment shown in FIG. 5, which is similar to the embodiment shown in FIG. 3, the localization of the melt is only achieved by means of the increased dissipation of heat by thermal radiation from the edge portions 17. The vaporizer boats according to FIGS. 4 and 5 are also shown in full scale, with a possible length of these vaporizer boats 5 as well as the embodiment shown in FIG. 3 being 250 mm. In the embodiment shown in FIG. 4, the "web" of the "T"-profile is 19 mm in width, with the total width of the profile being 28 mm and its height being 11 mm. The "legs" of the "T"-profile of this embodiment are 2 mm thick. Accordingly, FIG. 5 shows a cross-sectional form of the vaporizer boat with the "web" of the "T"-profile having a width of 15 mm, and the total width of the cross-sectional form being 47 mm. In this embodiment, the "legs" of the "T"-shaped cross-sectional form have a thickness of 1.5 mm. The total height of the cross-sectional form is 12 mm.

Referring to the embodiment shown in FIG. 3, it should yet be mentioned that in addition to the fact that the melt is localized only by means of an increased thermal radiation from the edge portion 17, an overall energy saving as compared to a rectangular cross section is achieved. This is because in relation to the volume of the vaporizer boat to be heated, the downwardly inclined radiation surfaces of the triangular cross section, on which thermal radiation losses primarily occur, are smaller as compared to the total area of the two lateral and the one downwardly extending radiation surfaces in a rectangular cross section, which account for the majority of radiation losses there.

In the following, some examples and comparative examples will be discussed:

Example No. 1 and Comparative Example No. 1

A vaporizer boat with a rectangular profile of 12×19×250 mm (standard size) was compared with a newly designed vaporizer according to FIG. 4 having a core area of 11×19 mm as well as projecting ends of 2×4.5 mm and an identical length. The two vaporizer boats were designed to have the same cross-sectional areas.

When the two vaporizer boats were compared, it already became clear at the time of heating that the reduced lateral edges had a significantly lower temperature because of the increased thermal radiation in the portion of the reduced edges.

After the aluminum wire had been supplied to the conventional rectangular profile having a cavity and to the central portion of the vaporizer boat according to FIG. 4, with both devices being operated at the same temperature, it became obvious before long that on the vaporizer boat with conventional rectangular cross section the spreading of the aluminum melt resulted in the aluminum flowing over the edges in the transverse direction and vaporizing laterally. With the newly designed vaporizer boat according to FIG. 4, however, this was not observed. Instead, the vaporizer boat was wet specifically in the axial direction, with a targeted vaporization in the vertical direction occuring at the same time.

Comparative Example No. 2

Since by definition the active evaporation surfaces in example no. 1 had to comprise different height-to-width ratios (in the case of the standard vaporizer with rectangular cross section 19×12×250 mm, and in the case of the newly designed vaporizer shown in FIG. 4 28×11×250 mm), it might well be suspected that the aluminum melt was prevented from flowing over the lateral edges by the increased width of the vaporizer boat. Therefore, a second experiment has been conducted using a vaporizer boat having a rectangular cross section of identical width and identical cross-sectional area and being 28×8.1 mm in size. This was compared with the newly designed vaporizer boat according to FIG. 4. It was again observed that the vaporizer boat with rectangular cross section had a homogeneous temperature distribution over its cross-sectional area. As soon as the vaporizer boat was wet by aluminum, it could be observed that the aluminum melt spread rapidly also in the transverse direction, and that it flowed over the edges, so that even for the wider vaporizer a lateral vaporization of the aluminum was clearly noticeable, be it was somewhat less than in the first comparative example.

Example No. 2

In order to more clearly characterize the effect of thermal radiation, a vaporizer boat was manufactured being 12×15 mm in the core portion ("web") and having laterally projecting ends ("legs") of 1.5×16 mm on each side, as well as a length of 250 mm, as shown in FIG. 5. When this vaporizer was operated under the same conditions as in example no. 1, an optimum spreading of the aluminum melt in the axial direction could be observed which was due to the central axial heating. It was also found that the melt was entirely prevented from flowing over the edges, and that there were even portions along the edges where wetting did not occur at all. The width-to-length ratio of the melt was 1:9, whereas the ratio of the vaporizer boat shown in FIG. 4 was 1:11. The wetting ratio according to the comparative examples 1 and 2, where a rectangular cross section of 12×19 mm and 28×8.1 mm, respectively, was used, amounted to a mere 1:4.5 mm and 1:5 mm, respectively, by contrast. Apart from the fact that the melt flowed over the longitudinal edges of the vaporizer boats according to the comparative examples, also the surface wetting of the evaporation surface was considerably less favourable, which resulted in a decreased evaporative capacity.

Example No. 3 and Comparative Example No. 3

In addition to the general geometrical shapes described in the examples no. 1 and 2, a vaporizer boat comprising a V-shaped cross section was tested. The width of this vaporizer boat was 30 mm, its maximum thickness was 10 mm and its length 150 mm. A vaporizer boat of this type is shown in FIG. 3. Also with this vaporizer boat, the increased energy loss caused by radiation losses on the edges led to a localization of the aluminum melt. The width-to-length ratio of the aluminum melt was 1:4.5, as opposed to 1:2.4 in a standard vaporizer of a 10×30 mm-rectangular cross section and an identical length of 150 mm. In total, the vaporizer boat according to FIG. 3 was clearly superior to the reference profile with the 10×30 mm rectangular cross section because of its reduced total energy loss by radiation, so that the use of a triangular profile according to FIG. 5 led to energy savings of about 25% on the basis of reduced radiation losses alone. This is accompanied by energy savings due to the small volume of the vaporizer boat to be heated.

What is claimed is:

1. A resistance-heated, ceramic vaporizer boat having a small cross dimension as compared to its longitudinal dimension, with the cross section of the vaporizer boat (5) being formed such that the relation between the surface area of the vaporizer boat (5) relative to the volume enclosed by this surface area increases in the transverse direction from the center towards the edges, and that the resistivity of the vaporizer boat is homogeneous across the cross-section, characterized in that the cross-sectional form is substantially that of a flat triangle, with the width-to-height ratio being at least 2:1.

2. A vaporizer boat as claimed in claim 1, characterized in that the width-to-height ratio is 3:1.

3. Vaporizer boat according to claim 1, characterized in that the vaporizer boat (5) comprises a completely even upper evaporation surface (18).

4. Vaporizer boat according to claim 2, characterized in that 20 the vaporizer boat (5) comprises a completely even upper evaporation surface (18).

5. A resistance-heated, ceramic vaporizer boat comprising an elongate center portion;

two elongate edge portions integral and homogeneous with and laterally to either side of the elongate center portion; and an evaporation surface extending across the elongate center portion and the two elongate edge portions, the elongate center portion being on average substantially thicker than the elongate edge portions and the elongate edge portions having a substantially higher cooling rate than the elongate center portion.

6. The resistance-heated, ceramic vaporizer boat of claim 5, the elongate center portion and the two elongate edge portions together defining a triangle in lateral cross section.

7. The resistance-heated, ceramic vaporizer boat of claim 6, the evaporation surface being at a first side of the triangle, the ratio of the length of the first side to the distance from the first side to the intersection of the remaining two sides being at least 2 to 1.

8. The resistance-heated, ceramic vaporizer boat of claim 7, the ratio being 3:1.

9. The resistance-heated, ceramic vaporizer boat of claim 5, the evaporation surface lying fully in a flat plane.

10. The resistance-heated, ceramic vaporizer boat of claim 5, the cooling rate of the edge portions being sufficiently higher than the elongate edge center portion that metal vaporization can occur on the evaporation surface of the elongate center portion without migration of the molten metal to the longitudinal edges of the evaporation surface of the elongate edge portions.

* * * * *